United States Patent
Lee

(10) Patent No.: US 9,270,256 B2
(45) Date of Patent: Feb. 23, 2016

(54) DUTY CYCLE CORRECTION CIRCUIT

(71) Applicant: SK hynix Inc., Gyeonggi-do (KR)

(72) Inventor: Hyun-Bae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/302,080

(22) Filed: Jun. 11, 2014

(65) Prior Publication Data

US 2015/0171836 A1    Jun. 18, 2015

(30) Foreign Application Priority Data

Dec. 12, 2013   (KR) ........................ 10-2013-0154718

(51) Int. Cl.
*H03K 3/017*    (2006.01)
*H03K 5/156*    (2006.01)

(52) U.S. Cl.
CPC .............. *H03K 3/017* (2013.01); *H03K 5/1565* (2013.01)

(58) Field of Classification Search
CPC ....................................... H03K 3/017
See application file for complete search history.

(56) References Cited

U.S. PATENT DOCUMENTS

| 7,579,890 | B2 | 8/2009 | Sohn | |
|---|---|---|---|---|
| 7,839,192 | B1 | 11/2010 | Wang | |
| 2012/0086489 | A1* | 4/2012 | Cherkassky et al. | .......... 327/175 |

* cited by examiner

*Primary Examiner* — Daniel Puentes
(74) *Attorney, Agent, or Firm* — IP & T Group LLP

(57) ABSTRACT

A duty cycle correction circuit may include an error booster suitable for amplifying an input clock duty error, a driver suitable for driving an output clock based on the input clock, and a duty corrector suitable for correcting the output clock duty based on the duty error amplified by the error booster.

8 Claims, 5 Drawing Sheets

DUTY CYCLE CORRECTION CIRCUIT

CROSS-REFERENCE TO RELATED APPLICATIONS

The present application claims priority of Korean Patent Application No. 10-2013-0154718, filed on Dec. 12, 2013, which is incorporated herein by reference in its entirety.

BACKGROUND

1. Field

Exemplary embodiments of the present invention relate to an integrated circuit design technology, and more particularly, to a duty cycle correction (DCC) circuit.

2. Description of the Related Art

In integrated circuit chips that operate based on a clock (e.g. a CPU, memory device, etc), it is important to accurately control clock duty. For example, in a memory device where data is inputted/outputted at a rising edge and a falling edge of a clock, it is assumed that the duty of the clock is approximately 50%. The timing between the rising edge and the falling edge is often distorted causing data to be inputted/outputted at the incorrect time. In order to prevent this from occurring, various clock-based integrated circuit chips have a duty cycle correction circuit that corrects the duty of the clock. When the duty of a clock is 50% it means the 'high' level period is substantially equal to the 'low' level period.

FIG. 1 is a block diagram illustrating a conventional duty cycle correction circuit.

Referring to FIG. 1, the duty cycle correction circuit includes a receiver (RX) 110, a driver 120, a duty detector 130, and a duty corrector 140.

The receiver 110 receives clocks CLK and CLKB inputted to the duty cycle correction circuit. For reference, the input clock CLK_INB is a complementary clock of the input clock CLK_IN. The driver 120 drives output clocks CLK_OUT and CLK_OUTB in response to input clocks CLK_IN and CLK_INB. The duty detector 130 detects the duty of the output clocks CLK_OUT and CLK_OUTB. The duty detection consists of detecting the 'high' level periods and 'low' level periods of the output clocks CLK_OUT and CLK_OUTB. The duty corrector 140 corrects the duty of the input clocks CLK_IN and CLK_INB based on a detection result of the duty detector 130. For example, when the duty detector 130 determines that the 'high' level period of the output clock CLK_OUT is too long, the duty corrector 140 increases 'low' level period of the input clock CLK_IN, and in an opposite case, the duty corrector 140 increases 'high' level period of the input clock CLK_IN. Since the driver 120 employs the clocks received by the receiver 110 and a duty correction value from the duty corrector 140 as an input, the output clocks CLK_OUT and CLK_OUTB, which are duty-corrected, may be outputted from the driver 120.

The feedback-type duty cycle correction circuit as illustrated in FIG. 1 increases or decreases 'high' pulse widths of the input clocks CLK_IN and CLK_INB incrementally using a feedback detection result, and is locked when the degree of distortion of the duty is reduced below a predetermined margin. That is, the duty cycle correction circuit operates similarly to a delay locked loop (DLL), and requires a separate locking time until the duty is corrected, similarly to the delay locked loop.

When a locking time is required before the duty is corrected, a device having a repeated idle mode and an active mode needs to wait for the locking time to correct the duty (the device needs to wake-up). Then, the operation mode of the device is changed from idle mode to active mode.

SUMMARY

Various embodiments of the present invention are directed to a duty cycle correction circuit that may correct duty in real-time without a separate locking time.

In an embodiment, a duty cycle correction circuit may include an error booster suitable for amplifying duty error of an input clock, a driver suitable for driving an output clock based on the input clock, and a duty corrector suitable for correcting the output clock duty based on the duty error amplified by the error booster.

In an embodiment, a duty cycle correction circuit may include a receiver suitable for receiving a clock and outputting an input clock, an error booster suitable for amplifying a duty error of the input clock, and an adjustable driver suitable for driving an output clock based on the input clock and the amplified duty error.

According to the embodiment of the present invention, a duty correction may be performed in real-time without a separate locking time.

DETAILED DESCRIPTION

Figure 1:
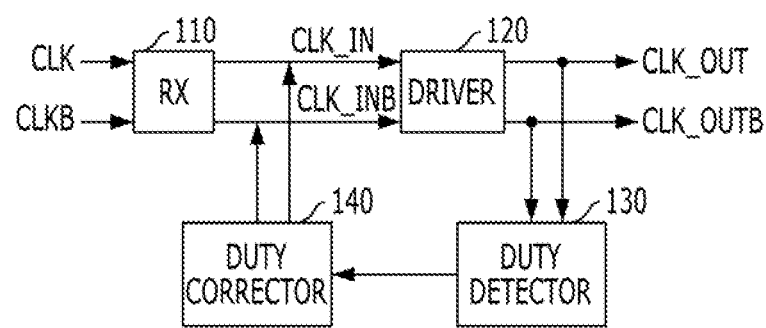
FIG. 1 is a block diagram illustrating a conventional duty cycle correction circuit.

Various embodiments will be described below in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and, in some instances, proportions may have been exaggerated to clearly illustrate features of the embodiments.

In this specification, specific terms have been used. The terms are used to describe the present invention and are not used to qualify the sense or limit the scope of the present invention. It is also noted that in this specification, 'and/or' represents that one or more components arranged before and after 'and/or' is included. Furthermore, "connected/coupled" refers to one component not only directly coupling another component but also indirectly coupling another component through an intermediate component. In addition, a singular form may include the plural form, and vice versa, as long as it is not specifically mentioned. Furthermore, 'include/comprise' or 'including/comprising' used in the specification represents that one or more components, steps, operations, and elements exists or are added.

Figure 2:
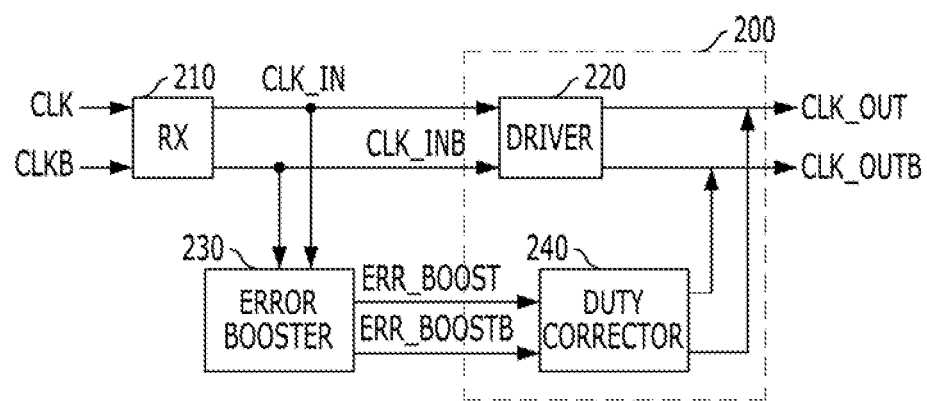
FIG. 2 is a block diagram illustrating a duty cycle correction circuit in accordance with an embodiment of the present invention.

FIG. 2 is a block diagram of a duty cycle correction circuit in accordance with an embodiment of the present invention.

Referring to FIG. 2, the duty cycle correction circuit may include a receiver (RX) 210, an error booster 230, and an adjustable driver 200. The adjustable driver 200 may include a driver 220 and a duty corrector 240.

The receiver 210 may receive clocks CLK and CLKB inputted to the duty cycle correction circuit. The driver 220 may drive output clocks CLK_OUT and CLK_OUTB in response to input clocks CLK_IN and CLK_INB.

The error booster 230 may amplify duty errors of the input clocks CLK_IN and CLK_INB and may output amplified duty errors ERR_BOOST and ERR_BOOSTB. Amplifying the duty error may increase the duty error relative to the input clocks. For example, when the ratio of a low pulse to high pulse of the input clocks CLK_IN and CLK_INB is 55:45 the ratio of low pulse to high pulse of the amplified duty errors ERR_BOOST and ERR_BOOSTB may be 65:35.

The duty corrector 240 may correct the duty of the output clocks CLK_OUT and CLK_OUTB in response to the amplified duty errors ERR_BOOST and ERR_BOOSTB. In detail, the duty corrector 240 may invert the amplified duty error signals ERR_BOOST and ERR_BOOSTB to drive the output clocks CLK_OUT and CLK_OUTB. That is, the duty corrector 240 may drive the output clock bar signal CLK_OUTB according to the amplified duty error signal ERR_BOOST and drive the output clock signal CLK_OUT according to the amplified duty error bar signal ERR_BOOSTB, thereby correcting the duty of the output clocks CLK_OUT and CLK_OUTB. Hereinafter, the term 'bar' used for a signal denotes a complementary signal of the corresponding signal, and a signal and a bar signal form differential signals.

Figure 3:
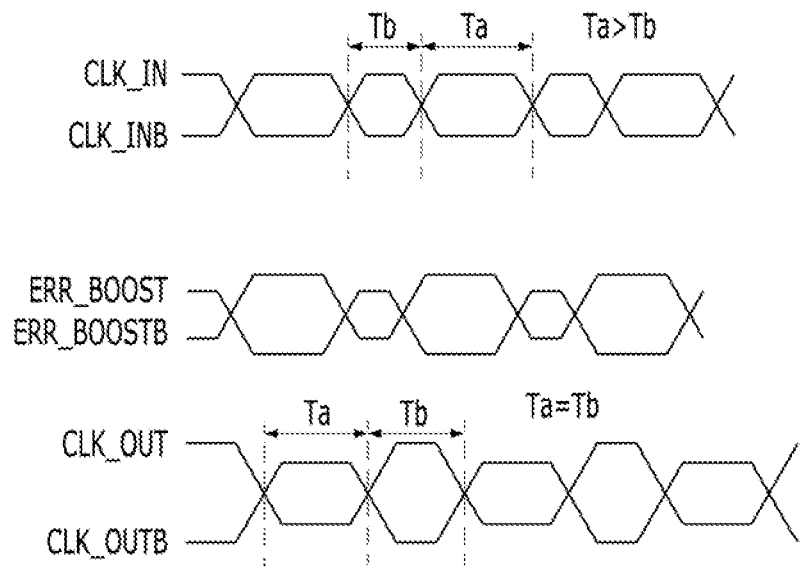
FIG. 3 is a timing diagram for describing an operation of the duty cycle correction circuit shown in FIG. 2.

FIG. 3 is a timing diagram or describing the operation of the duty cycle correction circuit shown in FIG. 2. Referring to FIG. 3, in the input clocks CLK_IN and CLK_INB, the duty of the 'low' pulse width Ta is distorted to be longer than the duty of a 'high' pulse width Tb on the basis of the signal CLK_IN. Since the amplified duty errors ERR_BOOST and ERR_BOOSTB are generated by amplifying the duty errors of the input clocks CLK_IN and CLK_INB, the amplified duty errors ERR_BOOST and ERR_BOOSTB have a highly distorted duty ratio as compared with the input clocks CLK_IN and CLK_INB. The driver 220 drives the input clocks CLK_IN and CLK_INB as the output clocks CLK_OUT and CLK_OUTB as they are, and the duty corrector 240 inverts the amplified duty errors ERR_BOOST and ERR_BOOSTB and drives them as the output clocks CLK_OUT and CLK_OUTB. Accordingly, the duty of the output clocks CLK. OUT and CLK_OUTB may be corrected such that a 'low' pulse width Ta is substantially equal to a 'high' pulse width Tb on the basis of the signal CLK_OUT.

According to the embodiment of FIG. 2, the duty errors of the input clocks CLK_IN and CLK_INB are amplified, and the duty errors of the output clocks CLK_OUT and CLK_OUTB are corrected using the amplified duty errors ERR_BOOST and ERR_BOOSTB in a feed-forward scheme. Accordingly, the duty errors of the output clocks CLK_OUT and CLK_OUTB may be corrected in real-time without a separate locking time.

Figure 4:
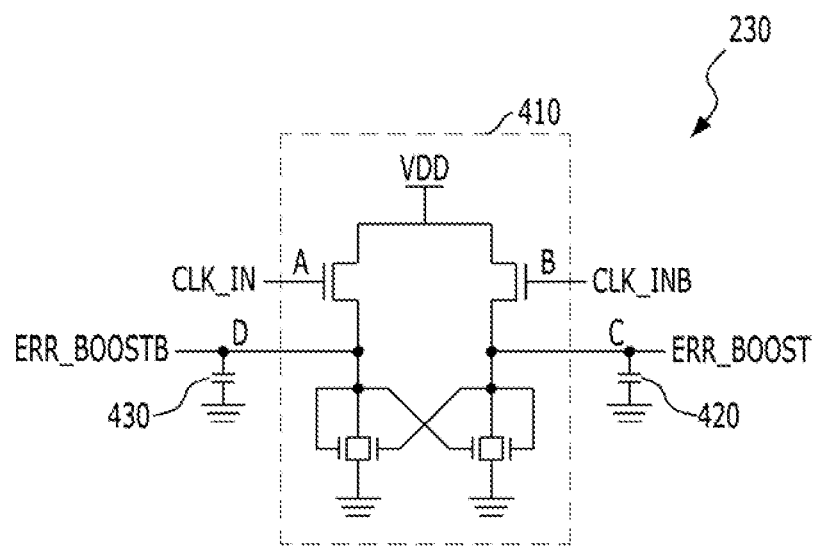
FIG. 4 is a detailed diagram of an error booster shown in FIG. 2.

FIG. 4 is a detailed diagram of the error booster 230 shown in FIG. 2.

Referring to FIG. 4, the error booster 230 may include a differential amplifier 410, a first capacitor 420, and a second capacitor 430.

The differential amplifier 410 may receive the input clock signal CLK_IN through an input terminal A thereof, receive the input clock bar signal CLK_INB through a complementary input terminal B thereof, output the amplified duty error signal ERR_BOOST through an output terminal C thereof, and output the amplified duty error bar signal ERR_BOOSTB through a complementary output terminal thereof.

The first capacitor 420 may be electrically coupled to the output terminal C and the second capacitor 430 may be electrically coupled to the complementary output terminal D. The capacitors 420 and 430 may be used in order to amplify the duty error of the amplified duty error signal ERR_BOOST and the duty error of the amplified duty error bar signal ERR_BOOSTB. For example, when a 'high' pulse width of the amplified duty error signal ERR_BOOST is longer than that of a 'low' pulse width thereof, a high voltage level is accumulated in the first capacitor 420, so that the 'high' pulse width of the amplified duty error signal ERR_BOOST may be lengthened and the 'low' pulse width may be shortened. Similarly, when the 'low' pulse width of the amplified duty error signal ERR_BOOST is longer than that of the 'high' pulse width, the low pulse width of the amplified duty error signal ERR_BOOST may be lengthened and the 'high' pulse width may be shortened by the first capacitor 420.

FIG. 4 is only an example of the error booster 230 that amplifies the duty error, and the error booster 230 may be designed by various schemes.

Figure 5:
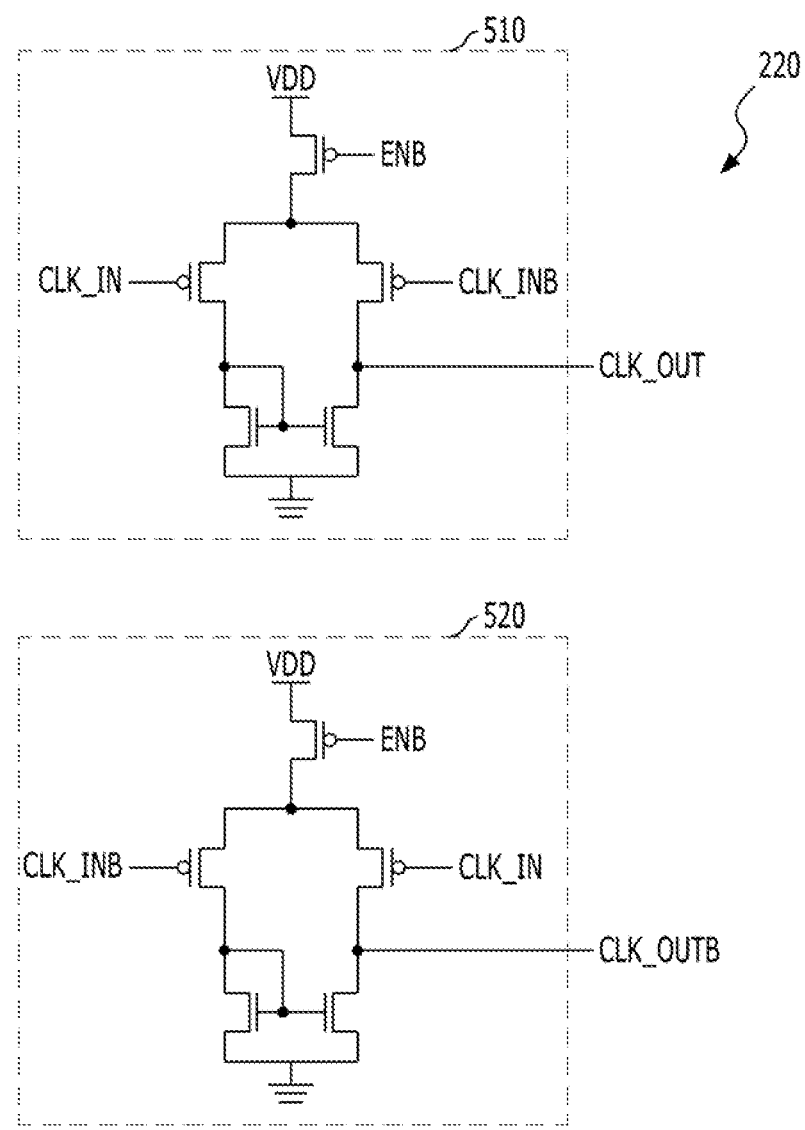
FIG. 5 is a detailed diagram of a driver shown in FIG. 2.

FIG. 5 is a detailed diagram of the driver 220 shown in FIG. 2.

Referring to FIG. 5, the driver 220 may include a first differential comparison unit 510 and a second differential comparison unit 520.

The first differential comparison unit 510 may receive the input clock signal CLK_IN and the input clock bar signal CLK_INB, and compare them with each other. The first differential comparison unit 510 may drive the output clock signal CLK_OUT to a 'high' level when the voltage level of the input clock signal CLK_IN is higher than that of the input clock bar signal CLK_INB, and drive the output clock signal CLK_OUT to a 'low' level when the voltage level of the input clock bar signal CLK_INB is higher than that of the input clock signal CLK_IN.

The second differential comparison unit 520 may receive the input clock signal CLK_IN and the input clock bar signal CLK_INB, and compare them with each other. The second differential comparison unit 520 may drive the output clock bar signal CLK_OUTB to a 'low' level when the voltage level of the input clock signal CLK_IN is higher than that of the input clock bar signal CLK_INB and drive the output clock bar signal CLK_OUTB to a 'high' level when the voltage level of the input clock bar signal CLK_INB is higher than that of the input clock signal CLK_IN.

An activation signal ENB may activate the driver 220 when the activation signal ENB is at a 'low' level.

FIG. 5 is only an example of the driver 220 that drives the output clocks CLK_OUT and CLK_OUTB in response to the input clocks CLK_IN and CLK_MB and the driver 220 may be designed by various schemes.

Figure 6:
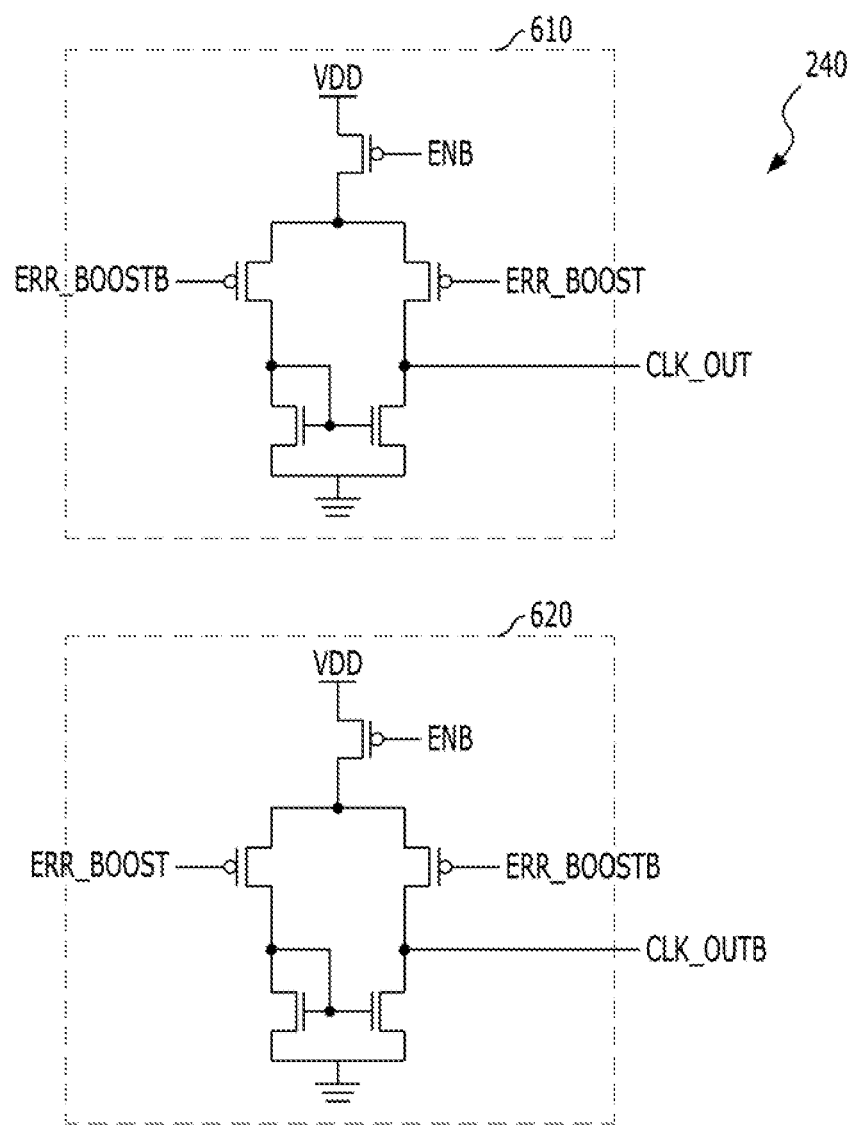
FIG. 6 is a detailed diagram of a duty corrector shown in FIG. 2.

FIG. 6 is a detailed diagram of the duty corrector 240 shown in FIG. 2.

Referring to FIG. 6, the duty corrector 240 may include a third differential comparison unit 610 and a fourth differential comparison unit 620.

The third differential comparison unit 610 may receive the amplified duty error signal ERR_BOOST and the amplified duty error bar signal ERR_BOOSTB, and compare them with each other. The third differential comparison unit 610 may drive the output clock signal CLK_OUT to a 'high' level when a voltage level of the amplified duty error bar signal ERR_BOOSTB is higher than that of the amplified duty error signal ERR_BOOST, and drive the output clock signal CLK_OUT to a 'low' level when the voltage level of the amplified duty error signal ERR_BOOST is higher than that of the amplified duty error bar signal ERR_BOOSTB.

The fourth differential' comparison unit 620 may receive the amplified duty error signal ERR_BOOST and the amplified duty error bar signal ERR_BOOSTB, and compare them with each other. The fourth differential comparison unit 620 may drive the output clock bar signal CLK_OUTB to a 'low' level when the voltage level of the amplified duty error bar signal ERR_BOOSTB is higher than that of the amplified duty error signal ERR_BOOST, and drive the output clock bar signal CLK_OUTB to a 'high' level when the voltage level of the amplified duty error signal ERR_BOOST is higher than that of the amplified duty error bar signal ERR_BOOSTB.

An activation signal ENB is a signal for activating/deactivating the duty corrector 240, and the duty corrector 240 may be activated when the activation signal ENB is at a 'low' level and may operate. The differential comparison units 610 and 620 of the duty corrector 240 may be designed to have driving strength lower than that of the differential comparison units 510 and 520 of the driver 220. For example, the amount of current flowing through the differential comparison units 510 and 520 may be smaller than the amount of current flowing through the differential comparison units 610 and 620.

Figure 7:
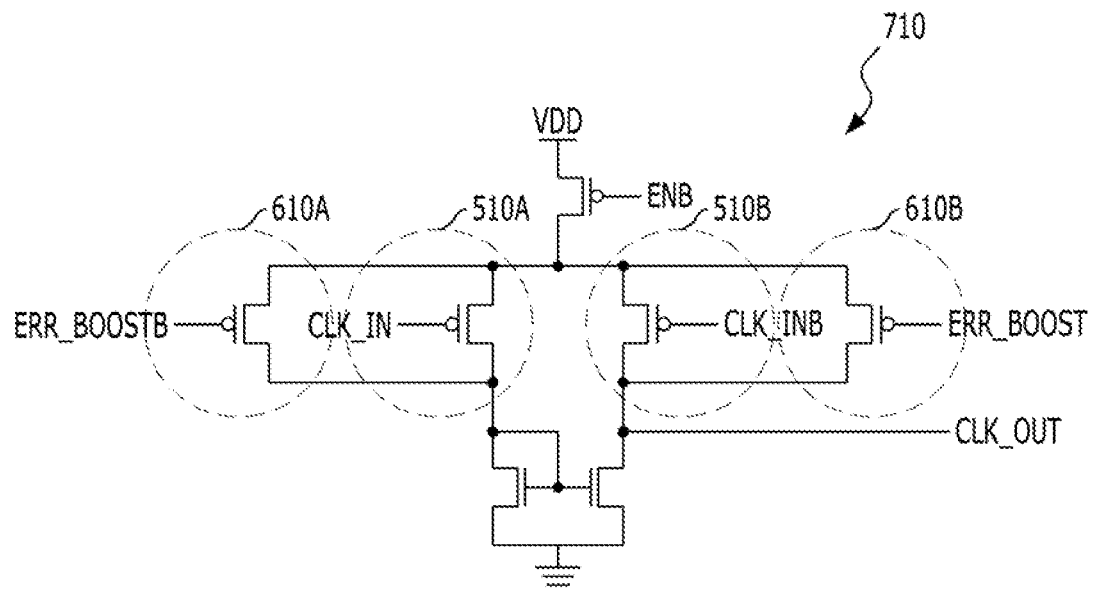
FIG. 7 is a detailed diagram of an adjustable driver shown in FIG. 2.
Figure 7:
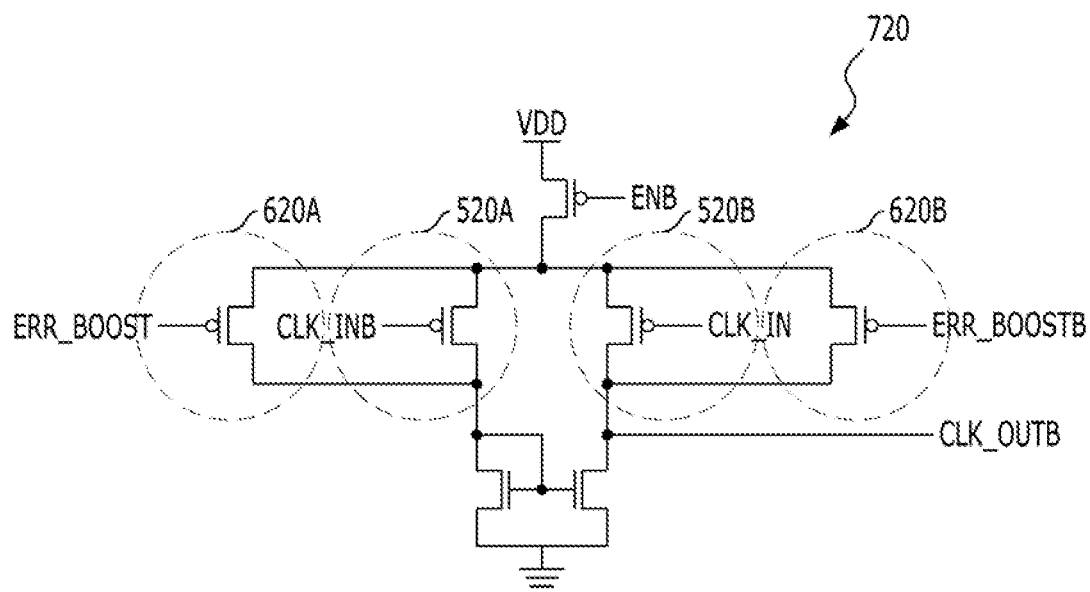

FIG. 6 is only an example of the duty corrector 240 that inverts the amplified duty errors ERR_BOOST and ERR_BOOSTB to drive the output clocks CLK_OUT and CLK_OUTB, and the duty corrector 240 may be designed by various schemes FIG. 7 is a detailed diagram of the adjustable driver 200 shown in FIG. 2.

Referring to FIG. 7, the adjustable driver 200 may include a fifth differential comparison unit 710 and a sixth differential comparison unit 720.

The fifth differential comparison unit 710 may compare the input clock signal CLK_IN and the amplified duty error bar signal ERR_BOOSTB with the input clock bar signal CLK_INB and the amplified duty error signal ERR_BOOST. The fifth differential comparison unit 710 may drive the output clock signal CLK_OUT to a 'high' level as the voltage levels of the input clock signal CLK_IN and the amplified duty error bar signal ERR_BOOSTB are higher than those of the input clock bar signal CLK_INB and the amplified duty error signal ERR_BOOST. In the fifth differential comparison unit 710, a part for comparing the input clock signal CLK_IN with the input clock bar signal CLK_INB may have the same circuit configuration as the first differential comparison unit 510 shown in FIG. 5, and a part for comparing the amplified duty error bar signal ERR_BOOSTB with the amplified duty error signal ERR_BOOST may have the same circuit configuration as the third differential comparison unit 610 shown in FIG. 6. That is, by coupling input PMOS transistors 610A and 610B corresponding to the duty corrector 240 in parallel with input PMOS transistors 510A and 510B corresponding to the driver 220, respectively, other parts of the fifth differential comparison unit 710 may be shared by the duty corrector 240. Here, the driving strength of the input PMOS transistors 610A and 610B corresponding to the duty corrector 240 may be lower than that of the input PMOS transistors 510A and 510B corresponding to the driver 220.

The sixth differential comparison unit 720 may compare the input clock signal CLK_IN and the amplified duty error bar signal ERR_BOOSTB with the input clock bar signal' CLK_INB and the amplified duty error signal ERR_BOOST. The sixth differential comparison unit 720 may drive the output clock bar signal CLK_OUTB to a 'low' level as the voltage levels of the input clock signal CLK_IN and the amplified duty error bar signal ERR_BOOSTB are higher than those of the input clock bar signal' CLK_INB and the amplified duty error signal ERR_BOOST. In the sixth differential comparison unit 720, a part for comparing the input clock signal CLK_IN with the input clock bar signal CLK_INB may have the same circuit configuration as the second differential comparison unit 520 shown in FIG. 5, and a part for comparing the amplified duty error bar signal ERR_BOOSTB with the amplified duty error signal ERR_BOOST may have the same circuit configuration as the fourth differential comparison unit 620 shown in FIG. 6. That is, by coupling input PMOS transistors 620A and 620B corresponding to the duty corrector 240 in parallel with input PMOS transistors 520A and 520B corresponding to the driver 220, respectively, other parts of the sixth differential comparison unit 710 may be shared by the duty corrector 240. Here, the driving strength of the input PMOS transistors 620A and 620E corresponding to the duty corrector 240 may be lower than that of the input PMOS transistors 520A and 520B corresponding to the driver 220.

Although various embodiments have been described for illustrative purposes, it will be apparent to those skilled in the art that various changes and modifications may be made without departing from the spirit and scope of the invention as defined in the following claims.

What is claimed is:

1. A duty cycle correction circuit comprising:
    an error booster suitable for amplifying a duty error of an input clock;
    a driver suitable for driving an output clock based on the input clock; and
    a duty corrector suitable for correcting a duty of the output clock based on the duty error amplified by the error booster,
    wherein the input clock includes an input clock signal and a complementary input clock signal, the amplified duty error includes an amplified duty error signal and a complementary amplified duty error signal, and the output clock includes an output clock signal and a complementary output clock signal, and
    wherein the driver comprises:
        a first differential comparison unit suitable for comparing the input clock signal with the complementary input clock signal, driving the output clock signal to a high level when a level of the input clock signal is higher than a level of the complementary input clock signal, and driving the output clock signal to a low level when the level of the complementary input clock signal is higher than the level of the input clock signal; and
        a second differential comparison unit suitable for comparing the input clock signal with the complementary input clock signal, driving the complementary output clock signal to a low level when the level of the input clock signal is higher than the level of the complementary input clock signal, and driving the complementary output clock signal to a high level when the level of the complementary input clock signal is higher than the level of the input clock signal.

2. The duty cycle correction circuit of claim 1, wherein the duty corrector inverts the amplified duty error and drives the inverted duty error as the output clock.

3. The duty cycle correction circuit of claim 1, wherein the driving strength of the duty corrector is lower than driving strength of the driver.

4. The duty cycle correction circuit of claim 1, wherein the duty corrector comprises:
- a third differential comparison unit suitable for comparing the amplified duty error signal and the complementary amplified duty error signal, driving the output clock signal to a high level when a level of the complementary amplified duty error signal is higher than a level of the amplified duty error signal, and driving the output clock signal to a low level when the level of the amplified duty error signal is higher than the level of the complementary amplified duty error signal; and
- a fourth differential comparison unit suitable for comparing the amplified duty error signal and the complementary amplified duty error signal, driving the complementary output clock signal to a low level when the level of the complementary amplified duty error signal is higher than the level of the amplified duty error signal, and driving the complementary output clock signal to a high level when the level of the amplified duty error signal is higher than the level of the complementary amplified duty error signal.

5. A duty cycle correction circuit comprising:
- a receiver suitable for receiving a clock and outputting an input clock;
- an error booster suitable for amplifying a duty error of the input clock; and
- an adjustable driver suitable for driving an output clock based on the input clock and the amplified duty error,
- wherein the input clock includes an input clock signal and a complementary input clock signal, the amplified duty error includes an amplified duty error signal and a complementary amplified duty error signal, and the output clock includes an output clock signal and a complementary output clock signal, and
- wherein the adjustable driver comprises:
  - a fifth differential comparison unit suitable for comparing the input clock signal and the complementary amplified error signal with the complementary input clock signal and the amplified duty error signal, and outputting a comparison result as the output clock signal; and
  - a sixth differential comparison unit suitable for comparing the input clock signal and the complementary amplified duty error signal with the complementary input clock signal and the amplified duty error signal, and outputting a comparison result as the complementary output clock signal.

6. A duty cycle correction circuit comprising:
- an error booster suitable for amplifying a duty error of an input clock;
- a driver suitable for driving an output clock based on the input clock; and
- a duty corrector suitable for correcting a duty of the output clock based on the duty error amplified by the error booster,
- wherein the input clock includes an input clock signal and a complementary input clock signal, the amplified duty error includes an amplified duty error signal and a complementary amplified duty error signal, and the output clock includes an output clock signal and a complementary output clock signal, and
- wherein the error booster comprises:
  - a differential amplifier suitable for receiving the input clock signal through an input terminal thereof, receiving the complementary input clock signal through a complementary input terminal thereof, outputting the amplified duty error signal through an output terminal thereof, and outputting the complementary amplified duty error signal through a complementary output terminal thereof;
  - a first capacitor electrically coupled between the output terminal and a ground; and
  - a second capacitor electrically coupled between the complementary output terminal and the ground.

7. The duty cycle correction circuit of claim 6, wherein the duty corrector comprises:
- a third differential comparison unit suitable for comparing the amplified duty error signal and the complementary amplified duty error signal, driving the output clock signal to a high level when a level of the complementary amplified duty error signal is higher than a level of the amplified duty error signal, and driving the output clock signal to a low level when the level of the amplified duty error signal is higher than the level of the complementary amplified duty error signal; and
- a fourth differential comparison unit suitable for comparing the amplified duty error signal and the complementary amplified duty error signal, driving the complementary output clock signal to a low level when the level of the complementary amplified duty error signal is higher than the level of the amplified duty error signal, and driving the complementary output clock signal to a high level when the level of the amplified duty error signal is higher than the level of the complementary amplified duty error signal.

8. A duty cycle correction circuit comprising:
- a receiver suitable for receiving a clock and outputting an input clock;
- an error booster suitable for amplifying a duty error of the input clock; and
- an adjustable driver suitable for driving an output clock based on the input clock and the amplified duty error,
- wherein the input clock includes an input clock signal and a complementary input clock signal, the amplified duty error includes an amplified duty error signal and a complementary amplified duty error signal, and the output clock includes an output clock signal and a complementary output clock signal, and
- wherein the error booster comprises:
  - a differential amplifier suitable for receiving the input clock signal through an input terminal thereof, receiving the complementary input clock signal through a complementary input terminal thereof, outputting the amplified duty error signal through an output terminal thereof, and outputting the complementary amplified duty error signal through a complementary output terminal thereof;
  - a first capacitor electrically coupled between the output terminal and a ground; and
  - a second capacitor electrically coupled between the complementary output terminal and the ground.

* * * * *